United States Patent [19]

Yamauchi et al.

[11] Patent Number: 4,671,828
[45] Date of Patent: Jun. 9, 1987

[54] MAGNETIC THIN FILM

[75] Inventors: Kazushi Yamauchi; Muneyuki Ogata; Tomio Kobayashi; Makoto Kubota; Tatsuo Kumura, all of Miyagi, Japan

[73] Assignee: Sony Corporation, Tokyo, Japan

[21] Appl. No.: 720,341

[22] Filed: Apr. 5, 1985

[30] Foreign Application Priority Data

Apr. 18, 1984 [JP] Japan .................. 59-76435

[51] Int. Cl.$^4$ ............................................. C04B 35/00
[52] U.S. Cl. .................................. 148/309; 428/606; 420/78
[58] Field of Search ............. 148/31.55; 75/123 L, 75/123 K, 124; 428/606

[56] References Cited

U.S. PATENT DOCUMENTS

| | | | |
|---|---|---|---|
| 3,089,795 | 5/1963 | Hu | 148/31.55 |
| 4,065,330 | 12/1977 | Masumoto et al. | 148/31.55 |
| 4,177,089 | 12/1979 | Bankson | 148/31.55 |
| 4,298,381 | 11/1981 | Kudo et al. | 148/31.55 |
| 4,337,087 | 6/1982 | Esashi et al. | 148/31.55 |

FOREIGN PATENT DOCUMENTS

| | | | |
|---|---|---|---|
| 53-119723 | 10/1978 | Japan | 75/124 |
| 55-62145 | 5/1980 | Japan | 75/124 |
| 55-125258 | 9/1980 | Japan | 75/124 |
| 56-38451 | 4/1981 | Japan | 75/124 |
| 56-44755 | 4/1981 | Japan | 75/124 |

Primary Examiner—John P. Sheehan
Attorney, Agent, or Firm—Hill, Van Santen, Steadman & Simpson

[57] ABSTRACT

A magnetic thin film consisting essentially of Fe, Al and Si and further containing oxygen has high magnetic permeability and high hardness without lowering the magnetic properties such as saturation magnetic flux density or coercive force.

The magnetic thin film has an increased specific resistivity and a lowered eddy current loss in the high frequency region and is suitable for a core material of magnetic transducer heads used in a high frequency region.

The magnetic thin film is prepared by, for example, physical vapor deposition or ion implantation.

9 Claims, 5 Drawing Figures

MAGNETIC THIN FILM

BACKGROUND OF THE INVENTION

1. Field of the Invention

This invention relates to a magnetic thin film and more particularly, to a magnetic thin film consisting essentially of Fe, Al and Si and also containing oxygen.

2. Description of the Prior Art

In magnetic recording apparatus such as, for example, video tape recorders (VTRs), researches are being made towards increasing the recording density and the frequency of the recording signals. In keeping pace with the tendency towards high density recording, so-called metal powder tapes making use of the powders of the ferromagnetic metals, such as Fe, Co or Ni, as magnetic powders, or so-called evaporated metal tapes in which the ferromagnetic metal material is deposited on the base film, are also used as the magnetic recording medium. By reason of the high coercive force Hc of said magnetic recording medium, head materials of the magnetic head for both recording and replaying are also required to have a high saturation magnetic flux density Bs. For instance, the ferrite material used frequently as low in saturation magnetic flux density Bs, whereas permalloy presents a problem in abrasion resistance.

On the other hand, in keeping pace with the above described tendency towards high density recording, researches are also made towards reducing the track width of the magnetic patterns on the magnetic recording medium, and the magnetic heads are required to be correspondingly narrow in track width.

It has been suggested to use a so-called composite type magnetic head wherein insulating films and magnetic thin film to be used subsequently as the magnetic core are alternately applied to a non-magnetic substrate, such as ceramic substrate so as to be used as track parts. It has been suggested to use a so-called thin film head in which the magnetic thin film and the electrically conductive thin films are deposited with the intermediary of thin insulation films for providing a multi-layered structure. Thus the general attention is directed to a Sendust alloy thin film consisting essentially of Fe, Al and Si as magnetic thin films employed in the type of the magnetic heads.

Because of its high saturation magnetic flux density Bs and relatively high hardness, the Sendust alloy thin film can be applied to the magnetic recording head which can record the signals on the magnetic recording medium having high coercive force, such as the aforementioned metal powder tape.

However, while being of relatively high hardness, the Sendust alloy thin film is inferior e.g. to ferrite in abrasion resistance and, being a metal material, it is relatively easy to rust.

In this connection, method were devised in which elements of Ti, Cr or Nb or platinum group are added to the Sendust alloy thin film besides main components, that is, Fe, Al and Si, for preventing the occurrence of rust and elevating the hardness and abrasion resistance.

However, it has been shown that addition of the afornentioned elements may cause saturation magnetic flux density Bs of the Sendust alloy thin film to be lowered. According to our experiments, the saturation magnetic flux density of the Sendust alloy thin film free of the aforementioned additives amounts to ca. 11000 Gauss, whereas the saturation magnetic flux density of the Sendust alloy thin film containing these additives amounts to ca. 9000 Gauss. Such reduction in the saturation magnetic flux density Bs is unfavorable with the magnetic recording medium having the high coercive force Hc such as metal powder tape.

In addition, when the metal material such as Sendust alloy thin film is used for the core of the magnetic head, there is presented a drawback that magnetic permeability is lowered in the high frequency region on account of the eddy current loss and hence a sufficient reproducing output is not achieved in the high frequency region.

It has also been suggested to replace the Sendust alloy thin film by non-crystalline magnetic alloys (so-called amorphous magnetic alloys) that are high in saturation magnetic flux density Bs and are not affected in magnetic permeability in the high frequency region. However, these non-crystalline magnetic alloys are unstable at high temperatures and are deteriorated markedly in magnetic permeability due to prolonged heating or heat cycles with a resultingly lowered reproducing efficiency. Above all, the materials can not be subjected to a temperature higher than 500° C. for prolonged time, because the materials can be crystallized under these conditions.

It is therefore not preferred to use the amorphous magnetic alloys for the preparation of magnetic heads which may involve the processing step at a temperature higher than 500° C., such as glass bonding.

SUMMARY OF THE INVENTION

It is therefore a principal object of the present invention to obviate the above described deficiency of the prior art and to provide a magnetic thin film which is thermally stable and superior in both magnetic properties and durability.

For accomplishing the above object, the present inventors have conducted perseverant researches, and found that, by adding oxygen to the magnetic thin film consisting essentially of Fe, Al, and Si, the hardness and magnetic permeability can be drastically improved without lowering the saturation magnetic flux density. The present invention, which has been completed on the basis of the above finding, resides in that it consists essentially of Fe, Al, and Si with Al contents being in the range from 2 to 10 weight percent and Si contents being in the range from 4 to 15 weight percent, said film also containing 0.005 to 5 weight percent of oxygen, the balance being Fe.

DESCRIPTION OF THE PREFERRED EMBODIMENTS

Figure 1:
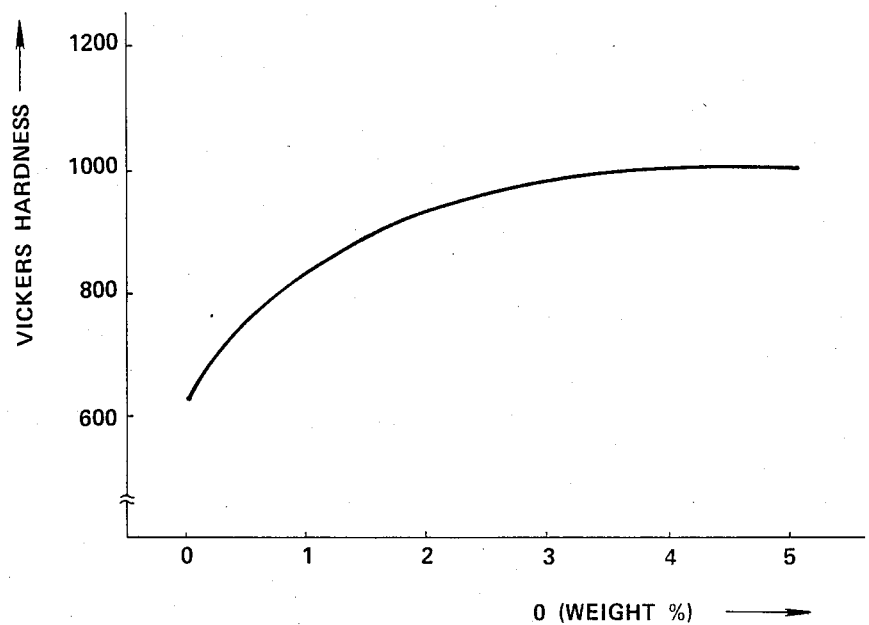
FIG. 1 is a characteristic diagram showing the relation between the O contents in the Fe-Al-Si alloy thin film and the Vickers hardness.

The magnetic thin film of the present invention consists essentially of Fe, Al and Si and, more importantly, it also contains oxygen (O).

By the O contents, magnetic permeability and hardness of the magnetic thin film are improved markedly.

Our experiments have revealed that, with increase in the contents of oxygen in the magnetic thin film, magnetic permeability is markedly improved, and that, above all, with the oxygen contents equal to ca. 1.5 weight percent, magnetic permeability may be increased by a factor of about 2 as compared to the oxygen free magnetic thin film. On the other hand, magnetic permeability is lowered with excess oxygen contents in the magnetic thin film. For example, with 1 MHz frequency, the oxygen contents less than 4 weight percent are preferred. However, since the specific resistivity of the aforementioned magnetic thin film is increased with increase in the oxygen contents, it is considered that the oxygen contents up to ca. 5 weight percent may be practically usable in a higher frequency region, for example, in conjunction with magnetic heads for digital VTRs.

Likewise, it has been shown that, with increase in the oxygen contents in the magnetic thin film, its Vickers hardness is also acutely increased and a substantially constant hardness is assured with the oxygen contents in excess of about 2 weight percent.

Therefore, the contents of oxygen (O) in the magnetic thin film of the present invention is preferably in the range from 0.005 to 5 weight percent. With the contents less than 0.005 weight percent, a sufficient effect can not be expected. With the contents higher than 5 weight percent, the magnetic permeability may be lowered and the coercive force Hc increased. In addition to oxygen O, nitrogen may also be contained in the magnetic thin film.

The preferred contents of the three main components of the magnetic thin film, that is, Fe, Al and Si, are such that the contents of Al and Si be 2 to 10 weight percent and 4 to 15 weight percent, respectively, the balance being Fe. That is, when the composition of the magnetic thin film is expressed as $Fe_a Al_b Si_c O_d$, where a, b, c and d denote weight ratio values of the respective components, the composition given by the following expressions $70 \leq a < 95$,
$2 \leq b \leq 10$,
$4 \leq c \leq 15$ and
$0.005 \leq d \leq 5$ is preferred. With the Al or Si contents higher or lesser than the above specified value, magnetic properties of the magnetic thin film are deteriorated.

It is possible that part of Fe be replaced by Co and/or Ni.

It is also possible that part of Fe can be replaced by Co for elevating the saturation magnetic flux density Bs. Above all, a maximum value of the saturation magnetic flux density Bs may be obtained with a composition in which 40 weight percent of Fe is replaced by Co. It is preferred that the ratio of substitution by Co be in the range of 0 to 60 weight percent related to Fe.

On the other hand, part of Fe may be replaced by Ni for maintaining a higher value of magnetic permeability without decreasing the saturation magntic flux density.

It is preferred that the ratio of substitution by Ni be in the range of 0 to 40 weight percent related to Fe.

Various other elements can be added to the magnetic thin film as additions for improving rust-proofness and abrasion resistance. These additives may include IIIa group elements including elements of lanthanum series such as Sc, Y, La Ce, Nd or Gd, IVa group elements such as Ti, Zr or Hf, Va group elements such as V, Nb or Ta, VIa group elements such as Cr, Mo or W, VIIa group elements such as Mn, Tc or Re, Ib group elements such as Cu, Ag or Au, and other elements such as Ga, In, Ge, Sn or Sb. These additives may be added either singly or as an admixture and in an amount of 0 to 10 weight percent related to the above described magnetic thin film. In this connection, when the magnetic thin film composition is expressed as

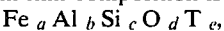
$Fe_a Al_b Si_c O_d T_e$, the composition is preferably such that the following expressions $65 \leq a < 95$,
$2 \leq b \leq 10$,
$4 \leq c \leq 15$
$0.005 \leq d \leq 6$,
$0 \leq e \leq 10$, and
$a+b+c+d+e = 100$ are satisfied. In these expressions, a, b, c, d and e denote the weight ratio values of the associated components and T denotes the aforementioned additive. With the amount of the additive in excess of 10 weight percent, magnetic properties of the magnetic thin film tend to be lowered.

Alternately, the elements of the platinum group such as Ru, Rh, Pd, Os, Ir or Pt may be used as the additive either singly or as an admixture. These platinum group elements may be added in an amount less than 40 weight percent. If these elements are added in an amount more than 40 weight percent, the magnetic properties of the magnetic thin film tend to be lowered.

Both the aforementioned additive such as the elements of the IIIa or IVa groups and the elements of the platinum group may be used in combination. In this case, when the magnetic thin film composition is expressed as

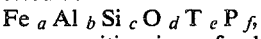
$Fe_a Al_b Si_c O_d T_e P_f$, the composition is preferably such that the following expressions $55 \leq a < 95$,
$2 \leq b \leq 10$,
$4 \leq c \leq 15$,
$0.005 \leq d \leq 6$,
$0 \leq e \leq 10$,
$0 \leq f \leq 40$, and
$a+b+c+d+e+f = 100$ are satisfied. In these expressions, a, b, c, d, e and f denote weight ratio values of the associated components, T denotes the aforementioned additive such as IIIa or IVa group elements and P the aforementioned platinum group elements. It should be noted that, when the elements of the platinum group the fifth period, that is, Ru, Rh, or Pd, are used as platinum group elements, preferably $e+f \leq 20$ and that, when the elements of the platinum group of the sixth period, that is, Os, Ir or Pt, are used as platinum group elements, then preferably $e+f \leq 40$. When the additive is used in excess of the above specified limit value, the magnetic properties tend to be lowered.

The film thickness of the magnetic thin film having the above composition is preferably more than 10Å and less than 1 mm and more preferably more than 10Å and less than 100 μm.

As described above high magnetic permeability and high hardness may be achieved with the magnetic thin film of the present invention by reason of the content of oxygen (O) without deterioration in the magnetic properties such as saturation magnetic flux density or coercive force. Above all, the contents of oxygen (O) give rise to an increased specific resistivity and a lowerd eddy current loss in the high frequency region so that the frequency characteristics of the magnetic permeability are improved with the result that the film may be effectively used with the magnetic heads used in a frequency region higher than 10 MHz.

It has been found that the magnetic thin film with contents of oxygen (O) as described above is also superior in durability. For example, no rust formation was observed on the film immersed in city water for three days.

Although it is not known precisely what role is played by the oxygen O in the magnetic thin film, it may be presumed that the drastically increased film hardness is possibly ascribable to the generation of the high hardness particles, such as oxide of Fe, alumina or silicon dioxide particles.

Various method may be possibly resorted to for the preparation of the magnetic thin film of the present invention. It is not possible to introduce a large amount of oxygen uniformly by resorting to, for example, the well-known smelting method, because the oxygen is then usually floated in the melting alloy as slug and separated as inclusion from the alloy.

Therefore, the magnetic thin film is preferably prepared by, for example, physical vapor deposition or ion implantation. The methods of physical vapor deposition may include flash vacuum evaporation, reactive vacuum evaporation, ion plating, sputtering or a cluster ion beaming. Deposition and ion implantation may also be carried out simultaneously. In introducing oxygen O into the magnetic thin film, the following methods may be used:

(i) The aforementioned physical vapor deposition for example, may be effected in an atmosphere containing an oxygen gas and the contents of the oxygen O in the resulting magnetic thin film are controlled by checking the concentration of the oxygen gas.

(ii) A compound of oxygen and at least one element of the aforementioned composition and an alloy of the remaining components are used as a deposition source so that oxygen may be introduced into the resulting magnetic thin film.

When adjusting the ratio values of the respective elements of the magnetic thin film, such as Fe, Al or Si, the following methods may be employed:

(i) Fe, Al, Si, other additives and replacement metals are weighed so that a preset relative composition is satisfied. The respective components are previously smelted in e.q. an induction furnace for forming an alloy ingot which may be used as a deposition source.

(ii) The deposition sources for the respective elements are prepared and the composition is controlled by activating the selected number of the deposition sources.

(iii) The respective deposition sources cf the component elements are provided and the input applied to these respectve sources (impressed voltage) is adjusted for controlling the deposition speed and hence the film composition.

(iv) The alloy is used as the deposition source and other elements are implanted during deposition.

The description with reference to several specific examples of the present invention is given hereinbelow. It should be noted that these examples are given only by may of illustration and are not intended for limiting the scope of the present invention.

EXAMPLE 1

Silicon (Si) with the purity of 99.9999%, aluminum (Al) with the purity of 99.99% and iron (Fe) with the purity of 99.99%, were used as the starting materials. These materials were separately prepared in weighed out amounts and smelted in vacuum in a high frequency smelting oven. The resulting batch was poured into a mold and cast into a target for cathode which is 50 mm in diameter and 1 mm in thickness. The target composition was $Fe_{82}Al_7Si_{11}$.

Under the following sputtering conditions, films were deposited in accordance with the planar magnetron type sputtering method by using the above target.
Sputtering Conditions:
RF input: 100 W;
distance between target and substrate: 30 mm;
substrate temperature: ~20° C. (with water cooling);
ultimate pressure: $3 \times 10^{-6}$ Torr;
Ar gas pressure: $4 \times 10^{-3}$ Torr;
film thickness: ca. 6 μm.

In accordance with the above sputtering conditions, a sputtering operation was carried out with the addition of oxygen ($O_2$) into an Ar as the inert gas. During the sputtering operation, the ratio of $O_2$ in the inert gas was changed by controlling the partial pressure of the $O_2$ gas which is an index of the $O_2$ ratio in the inert gas. In this manner, the Fe-Al-Si alloy thin film was formed on the crystallized glass substrate. After heat-treating the resulting Fe-Al-Si alloy thin film at 550° C. for one hour, the hardness, specific resistivity, magnetic permeability and saturation magnetic flux density were measured.

In the characteristic diagram of FIG. 1, there is shown the relation between the hardness and the ratio of O contained in the Fe-Al-Si alloy thin film. The hardness was measured herein in terms of the Vickers hardness and with a weight of 50 g applied for 15 seconds for weighting.

It can be seen from this figure that, with an increase in the ratio of O in the Fe-Al-Si alloy thin film, the hardness of the Fe-Al-Si alloy thin film is appreciably increased. For example, the hardness Hv of the Fe-Al-Si alloy film completely free of O amounts to 630, whereas the hardness Hv of the Fe-Al-Si alloy thin film with contents of 3.8 weight percent of O amounts to 1000.

Figure 2:
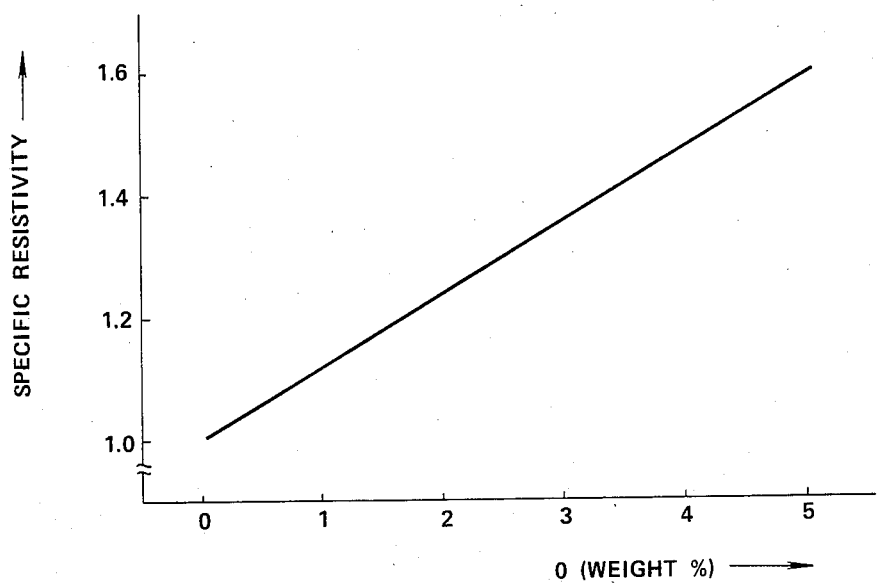
FIG. 2 is a characteristic diagram showing the relation between the O contents in the Fe-Al-Si alloy thin film and the specific resistivity with the resistivity of the O-free Fe-Al-Si alloy thin film being one.

In the characteristic diagram shown in FIG. 2, there is shown the relation between the electrical resistace (specific resistivity) and the ratio of O in the Fe-Al-Si alloy thin film. It should be noted that the electrical resistance was measured by the four-terminal method and as the specific resistivity with the electrical resistance of the O-free Fe-Al-Si alloy thin film as 1.0.

This specific resistivity is a critical factor for estimating magnetic permeability of the Fe-Al-Si alloy thin film in the high frequency region. Thus, in general, a coaxial like induction current (eddy current) flows in the magnetic body by the temporally changing magnetic flux, such eddy current causing a power consumption known as eddy current loss. This eddy current loss is markedly related with the frequency and the resistivity of the magnetc material and gives rise to decreased permeability especially in the high frequency region. It is known for example that magnetic permeability of the ordinary Sendnst alloy material tends to be lowered in the high frequency region, since the resistivity of the material is 85 $\mu\Omega$cm which is much lower than that of the amorphous alloy material which is 150 $\mu\Omega$cm. Therefore, the larger resistivity of the resulting Fe-Al-Si alloy thin film is preferred. It is seen from FIG. 2 that, with the increase in the O ratio, the specific resistivity of the Fe-Al-Si alloy thin film is linearly increased. It is therefore presumed that O-containing the Fe-Al-Si alloy film is also excellent in magnetic permeability in the high frequency region.

Figure 3:
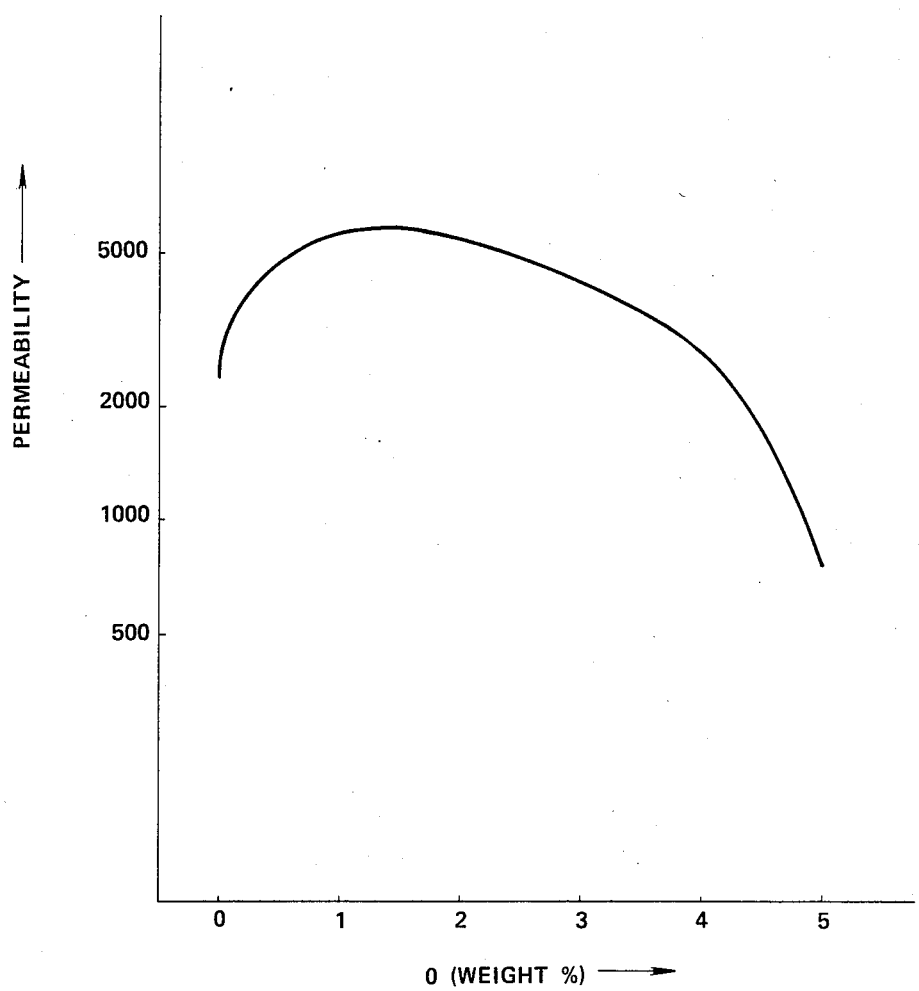
FIG. 3 is a characteristic diagram showing the relation between O contents in the Fe-Al-Si alloy thin film and magnetic permeability at 1 MHz.

In the characteristic diagram shown in FIG. 3, there is shown the relation between the O ratio in the Fe-Al-Si alloy film and magnetic permeability at 1 MHz. Measurement of magnetic permeability was made with the aid of a permiance meter. It is seen from FIG. 3 that magnetic permeability of the Fe Al-Si alloy thin film is notably increased with increase in the O ratio. For instance, with the O ratio of 1 weight percent, magnetic permeability is improved by a factor of about 2.5.

Figure 4:
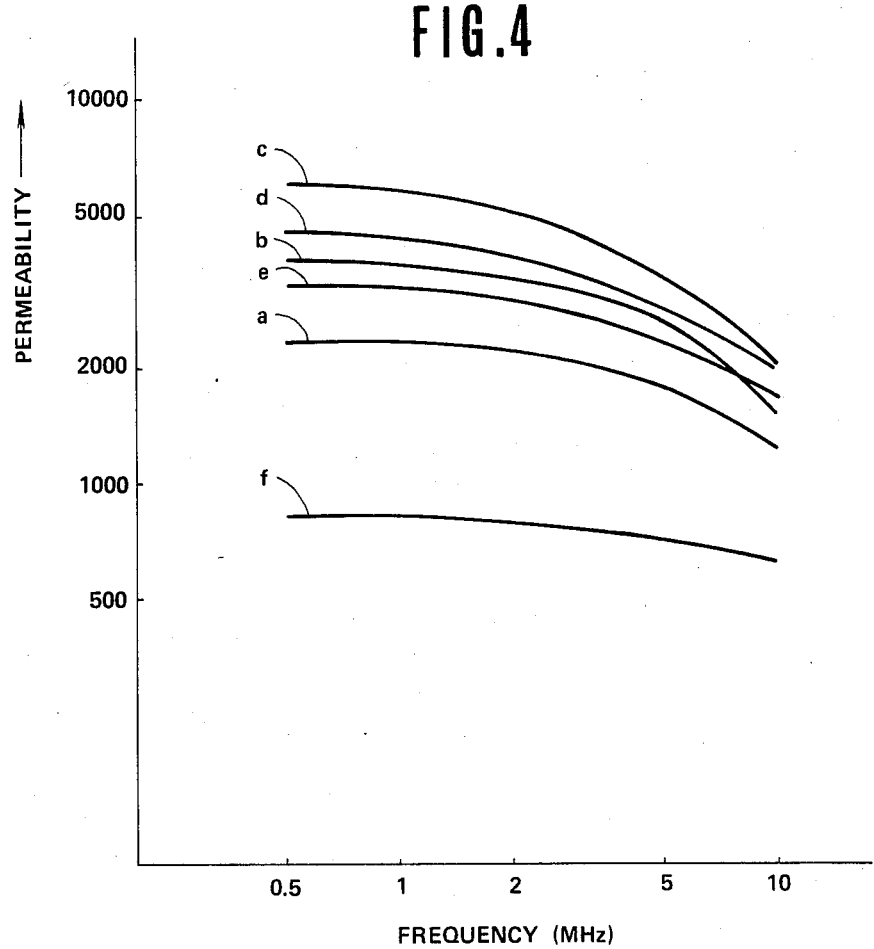
FIG. 4 is a characteristic diagram showing frequency characteristics of magnetic permeability of the O-containing Fe-Al-Si alloy thin film.

FIG. 4 shows frequency characteristics of magnetic permeability of the O-containing Fe-Al-Si alloy thin film. In this figure, the curve a represents the frequency characteristics for O contents of O weight percent, the curve b those for O contents of 0.3 weight percent, the curve c those for O contents of 1.0 weight percent, the curve d those for O contents of 2.4 weight percent, the curve e those for O contents of 3.8 weight percent and the curve f those for O contents of 4.9 weight percent.

It is seen from FIG. 4 that the Fe-Al-Si alloy thin film with O contents exhibits a higher magnetic permeability in any frequency than that without O contents. Above all, it may be appreciated that decrease in magnetic permeability in the higher frequency tends to be reduced with increase in the O contents. For example, the alloy thin film with O contents of 4.9 weight percent may be sufficiently employed in the frequency range of 20 to 30 MHz, although it exhibits a low magnetic permeability in the frequency region less than 10 MHz.

Figure 5:
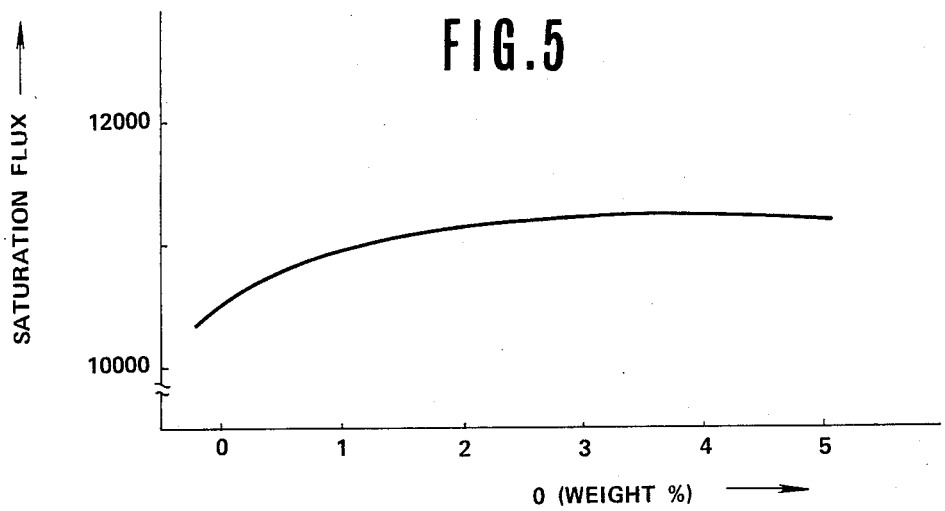
FIG. 5 is a characteristic diagram showing the relation between the contents of O in the Fe-Al-Si alloy thin film and the saturation magnetic flux density.

In the characteristic diagram of FIG. 5, there is shown the relation between the saturation magnetic flux density and the O contents of the Fe-Al-Si alloy thin film.

In connection with the figure, it is of interest that the saturation magnetic flux density of the Fe-Al-Si alloy thin film is increased by the addition of O into the film. This may be highly meritorious in consideration that the saturation magnetic flux density is generally lowered by using additives aimed to improve hardness or temperature characteristics of the magnetic permeability. In the present Example, not only the reduction in the saturation magnetic flux density is prevented, but the saturation magnetic flux density is improved.

It is seen from these results that the Fe-Al-Si alloy thin film is not only superior in hardness, rust-proofness or durability but also superior in magnetic characteristics such as permeability or saturation magnetic flux density and hence may be advantageously used e.g. in conjunction with magnetic heads.

EXAMPLE 2

A composite target consiting of pure iron targets on which were placed Al and Si, or a composite target consisting of $Fe_{82}Al_7Si_{11}$ targets on which were placed Fe, Al and Si, were used as target, and the sputtering operation was carried out in an $O_2$-containing Ar gas and an $O_2$-free Ar gas, while the number of Al and Si targets or Fe, Al and Si targets was changed, for the preparation of the Fe-Al-Si alloy thin film of various compositions (with thickness of about 5 $\mu$m).

The resulting Fe-Al-Si alloy thin film was heat-treated at 350° C. to 800° C. for 1-5 hours. Then, magnetic permeability of the film was measured with the aid of a permiance meter and the Vickers hardness was also measured with weighting of 50 g. The composition of the resulting Fe-Al-Si alloy thin film was analyzed as to Fe, Al and Si contents with the aid of an X-ray microanalyzer. The oxygen contents were measured by the gas analysis of the magnetic thin film formed on the Ni substrate. The results are shown in Table 1.

TABLE 1

| | composition (wt. %) | | | | permeability | | Vickers |
|---|---|---|---|---|---|---|---|
| | Fe | Al | Si | O | 1 MHz | 5 MHz | hardness |
| comp. sample 1 | 94.8 | 2.1 | 3.1 | 0 | 260 | 220 | 580 |
| sample 1 | (94.8 | 2.1 | 3.1) ×0.978 | 2.2 | 360 | 310 | 690 |
| comp. sample 2 | 91.6 | 2.6 | 5.8 | 0 | 390 | 330 | 650 |
| sample 2 | (91.6 | 2.6 | 5.8) ×0.978 | 2.2 | 460 | 400 | 780 |
| comp. sample 3 | 87.1 | 9.8 | 3.3 | 0 | 280 | 240 | 620 |
| sample 3 | (87.1 | 9.8 | 3.3) ×0.978 | 2.2 | 390 | 320 | 750 |
| comp. sample 4 | 85.1 | 5.6 | 9.3 | 0 | 2300 | 1820 | 660 |
| sample 4 | (85.1 | 5.6 | 9.3) ×0.978 | 2.2 | 4320 | 2880 | 860 |
| comp. sample 5 | 82.4 | 8.2 | 9.4 | 0 | 1550 | 1450 | 770 |
| sample 5 | (82.4 | 8.2 | 9.4) ×0.978 | 2.2 | 1720 | 1030 | 870 |
| comp. sample 6 | 80.4 | 8.7 | 10.9 | 0 | 270 | 200 | 590 |
| sample 6 | (80.4 | 8.7 | 10.9) ×0.978 | 2.2 | 1580 | 1310 | 950 |
| comp. sample 7 | 86.3 | 2.4 | 11.3 | 0 | 380 | 330 | 700 |
| sample 7 | (86.3 | 2.4 | 11.3) ×0.978 | 2.2 | 490 | 470 | 980 |
| comp. sample 8 | 78.1 | 8.2 | 13.7 | 0 | 110 | 90 | 640 |
| sample 8 | (78.1 | 8.2 | 13.7) ×0.978 | 2.2 | 640 | 600 | 960 |
| comp. sample 9 | 78.7 | 6.3 | 15.0 | 0 | 100 | 70 | 800 |
| sample 9 | (78.7 | 6.3 | 15.0) ×0.978 | 2.2 | 650 | 600 | 1050 |
| comp. sample 10 | 74.6 | 9.7 | 15.7 | 0 | 50 | 45 | 780 |
| sample 10 | 74.6 | 9.7 | 15.7 ×0.978 | 0 | 50 | 45 | 780 |

It is seen from the above Table that the samples 1 to 10 with O contents of 2.2 weight percent exhibit magnetic permeability higher than that of the O-free comparative samples and that,from the permeability values above all for 1 MHz and 5 MHz, the frequency characteristics are also improved. Likewise, it is seen that the Vickers hardness is also improved by ca. 200 to 300.

EXAMPLE 3

A composite target consisting of a pure iron target on which Al, Si and Co or Ni were mounted was used as target and the sputtering operation was carried out in an $O_2$-containing Ar gas and in an $O_2$-free Ar gas for the preparation of the Fe-Al-Si alloy thin film.

The saturation magetic flux density, permeability and the Vickers hardness of the resulting Fe-Al-Si alloy thin film were measured. The results are shown in Table 2 below.

sured. The results are shown in Table 3. Measurement of magnetic permeability was effected with the aid of a permiance meter, while measurement of the Vickers hardness was effected with weighting of 50 g for 15

TABLE 2

|  | composition (wt. %) | | | | | permeability | | Vickers | saturation magnetic flux density |
|---|---|---|---|---|---|---|---|---|---|
|  | Fe | Al | Si | Co or Ni | O | 1 MHz | 5 MHz | hardness | (gauss) |
| comp. sample 11 | 76.6 | 5.5 | 9.5 | Co 8.4 | — | 1260 | 840 | 680 | 12000 |
| sample 11 | (76.6 | 5.5 | 9.5 | Co 8.4) x 0.978 | 2.2 | 2640 | 2090 | 850 | 12000 |
| comp. sample 12 | 87.2 | 3.8 | 5.9 | Ni 3.1) | — | 1120 | 760 | 640 | 11000 |
| sample 12 | (87.2 | 3.8 | 5.9 | Ni 3.1) x 0.978 | 2.2 | 2240 | 1830 | 760 | 11000 |

It is seen from Table 2 that the Vickers hardness as well as magnetic permeability of the samples 11 and 12 with O contents of 2.2 weight percent were improved over those of the O-free comparative samples 11 and 12, while the saturation magnetic flux density of the samples 11 and 12 were not inferior to that of the comparative samples 11 and 12.

seconds. The metal components of the resulting magnetic thin film were analyzed with an X-ray microanalyzer and the O contents were determined by the gas analysis of the magnetic thin film simultaneously formed on the Ni substrate.

TABLE 3

| | composition (wt. %) | | | | | | | |
|---|---|---|---|---|---|---|---|---|
| | | | | additive elements | | | | |
| | Si | Al | O | designation | contents | Fe | permeability (1 MHz) | Vickers hardness |
| comp. sample 13 | 9.4 | 5.5 | — | — | — | balance | 2500 | 660 |
| sample 13 | 9.4 | 5.5 | 0.1 | — | — | balance | 2680 | 690 |
| sample 14 | 9.3 | 5.4 | 0.6 | — | — | balance | 3790 | 810 |
| sample 15 | 9.3 | 5.3 | 1.5 | — | — | balance | 5340 | 990 |
| sample 16 | 9.0 | 5.0 | 3.9 | — | — | balance | 1250 | 1020 |
| sample 17 | 9.3 | 5.2 | 0.2 | Cr | 2.1 | balance | 2830 | 700 |
| sample 18 | 9.5 | 5.6 | 0.2 | Cr | 4.8 | balance | 2700 | 720 |
| sample 19 | 9.2 | 5.1 | 1.8 | Y | 1.8 | balance | 4620 | 1000 |
| sample 20 | 9.4 | 5.5 | 0.3 | Ti | 2.2 | balance | 2750 | 690 |
| sample 21 | 9.4 | 5.5 | 0.5 | Nb | 2.1 | balance | 2930 | 830 |
| sample 22 | 9.1 | 5.1 | 0.5 | Nb | 4.8 | balance | 2740 | 840 |
| sample 23 | 9.4 | 5.4 | 0.8 | Ru | 1.9 | balance | 3070 | 860 |
| sample 24 | 8.8 | 5.0 | 0.7 | Ru | 4.9 | balance | 2810 | 820 |
| sample 25 | 9.4 | 5.4 | 0.8 | Cu | 1.5 | balance | 3200 | 840 |
| sample 26 | 9.3 | 5.2 | 0.6 | Cu | 3.4 | balance | 2580 | 740 |
| sample 27 | 9.4 | 5.5 | 0.8 | In | 1.3 | balance | 2760 | 710 |
| sample 28 | 9.2 | 5.1 | 0.4 | In | 4.1 | balance | 2690 | 660 |
| comp. sample 14 | 3.3 | 9.8 | — | — | — | balance | 280 | 620 |
| sample 29 | 3.4 | 9.8 | 1.3 | — | — | balance | 710 | 1020 |
| sample 30 | 3.5 | 9.7 | 1.5 | Y | 5.1 | balance | 510 | 980 |
| comp. sample 15 | 15.0 | 6.3 | — | — | — | balance | 100 | 800 |
| sample 31 | 15.0 | 6.5 | 1.2 | — | — | balance | 270 | 1080 |
| sample 32 | 15.0 | 6.1 | 0.3 | Ti | 4.9 | balance | 320 | 710 |

EXAMPLE 4

Silicion (Si) with the purity of 99.9999 percent, aluminum (Al) with the purity of 99.99 percent and iron (Fe) with the purity of 99.99 percent were used as the starting materials. These starting materials were separately prepared in such weight amounts as to give a predetermined relative composition. The resulting batch was smelted in vacuum by using a high frequency smelting oven. The resulting molten product was poured into a mold for the preparaton of the alloy target.

On this alloy target as reference were placed such elements as Fe, Al, Si and other additive elements, and the overall unit was charged into a high frequency sputtering unit, where sputtering was carried out in a Ar gas atmosphere containing oxygen gas $O_2$ for the magnetic thin film about 5 μm thickness.

After heat-treatment at 350° to 800° C. for 1 to 5 hours, magnetic permeability as well as the Vickers hardness of the resulting magnetic thin film was measured.

It is seen from Table 3 that magnetic permeability as well as the Vickers hardness of the oxygen-containing magnetic thin film is markedly improved over those of the oxygen-free magnetic thin film.

The saturation magnetic flux density and the coercive force were also measured in the above Examples and comparative Examples and were found to be substantially unchanged no matter whether or not oxygen was contained in the film samples. For example, while the saturation magnetic flux density and the coercive force of the comparative sample 13 amount to 11000 gauss and 0.3 oerstead, respectively, the saturation magnetic flux density of the sample 13 amounts to 11000 gauss and the coercive force of the same sample amounts to 0.3 oersted.

It will be appreciated from the foregoing that the present invention allows to provide a magnetic thin film high in hardness and superior in magnetic properties.

What is claimed is:

1. A magnetic thin film having a thickness of more than 10 Angstroms and less than 100 microns and a composition represented by the following formula:

$Fe_a Al_b Si_c O_d$ wherein a, b, c and d each represents a weight percent of the respective elements and satisfies the following relations of $70 \leq a < 95$
$2 \leq b \leq 10$
$4 \leq c \leq 15$
$0.1 \leq d \leq 5$,
$a+b+c+d = 100$.

2. A magnetic thin film having a thickness of more than 10 Angstroms and less than 100 microns and a composition represented by the following formula:

$Fe_a Al_b Si_c O_d T_e$ wherein T is at least one selected from the group consisting of IIIa group elements Sc, Y, La, Ce, Nd, or Gd, IVa group elements Ti, Zr or Hf, Va group elements V, Nb, or Ta, VIa group elements Cr, Mo or W, VIIa group elements Mn, Tc, or Re, Ib group elements, Cu, Ag, or Au or, Ga, In, Ge, Sn and Sb and a, b, c, d and e each represents a weight percent of the respective elements and satisfies the following relations of $65 \leq a < 95$
$2 \leq b \leq 10$
$4 \leq c \leq 15$
$0.1 \leq d \leq 6$
$0 \leq e \leq 10$
$a+b+c+d+e = 100$.

3. A magnetic thin film having a thickness of more than 10 Angstroms and less than 100 microns and a composition represented by the following formula:

$Fe_a Al_b Si_c O_d X_e$ wherein X is at least one of platinium group elements Ru, Rh, Pd, Os, Ir, or Pt and a, b, c, d and e each represents a weight percent of the respective elements and satisfies the following relations of $65 \leq a < 95$
$2 \leq b \leq 10$
$4 \leq c \leq 15$
$0.1 \leq d \leq 6$
$0 \leq e \leq 40$.

4. A magnetic thin film having a thickness of more than 10 Angstroms and less than 100 microns and a composition represented by the following formula:

$Fe_a Al_b Si_c O_d T_e X_f$ wherein T is at least one selected from the group consisting of IIIa group elements Sc, Y, La, Ce, Nd, or Gd, IVa group elements Ti, Zr, or Hf, Va group elements V, Nb, or Ta, VIa group elements Cr, Mo, or W, VIIa group elements Mn, Tc, or Re, Ib group elements Cu, Ag or Au, Ga, In, Ge, Sn and Sb and X is at least one of platinum group elements Ru, Rh, Pd, Os, Ir, or Pt and a, b, c, d, e and f each represents a weight percent of the respective elements and satisfies the following relations of $55 \leq a < 95$
$2 \leq b \leq 10$
$4 \leq c \leq 15$
$0.1 \leq d \leq 6$
$0 \leq e \leq 10$
$0 \leq f \leq 40$
$a+b+c+d+e+f = 100$.

5. A magnetic thin film according to claim 4, wherein said e and f satisfy the relation of $e+f \leq 20$ when Ru, Rh or Pd is used for platinum group elements.

6. A magnetic thin film according to claim 4, wherein said e and f satisfy the relation of $e+f \leq 40$ when Os, Ir or Pt is used for platinum group elements.

7. A magnetic thin film according to any one of claims 1 to 5, wherein a part of Fe is substituted by Co or Ni.

8. A magnetic thin film according to claim 6, wherein a ratio of substitution by Co is in the range of 0 to 60 weight percent related to Fe.

9. A magnetic thin film according to claim 6, wherein a ratio of substitution by Ni is in the range of 0 to 40 weight percent related to Fe.

* * * * *